(12) United States Patent
Hector et al.

(10) Patent No.: US 7,208,760 B2
(45) Date of Patent: Apr. 24, 2007

(54) ACTIVE MATRIX ELECTROLUMINESCENT DISPLAY DEVICES, AND THEIR MANUFACTURE

(75) Inventors: Jason Roderick Hector, Redhill (GB); Nigel David Young, Redhill (GB); David Andrew Fish, Haywards Heath (GB); Mark Jonathan Childs, Sutton (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 259 days.

(21) Appl. No.: 10/507,771

(22) PCT Filed: Mar. 19, 2003

(86) PCT No.: PCT/IB03/00999

§ 371 (c)(1),
(2), (4) Date: Sep. 15, 2004

(87) PCT Pub. No.: WO03/079442

PCT Pub. Date: Sep. 25, 2003

(65) Prior Publication Data

US 2005/0146279 A1 Jul. 7, 2005

(30) Foreign Application Priority Data

Mar. 20, 2002 (GB) ................... 0206551.4
Apr. 26, 2002 (GB) ................... 0209557.8
Jul. 11, 2002 (GB) ................... 0216053.9

(51) Int. Cl.
*H01L 29/04* (2006.01)
(52) U.S. Cl. ................................ 257/59; 257/72
(58) Field of Classification Search ............ 315/169.1, 315/169.3; 343/82–92; 345/82–92; 257/59, 257/72, 359
See application file for complete search history.

(56) References Cited

U.S. PATENT DOCUMENTS 6,281,634 B1 * 8/2001 Yokoyama ............... 315/169.3
(Continued)

FOREIGN PATENT DOCUMENTS

EP 0895219 A1 2/1999
(Continued)

*Primary Examiner*—Hoanganh Le
*Assistant Examiner*—Tung Le
(74) *Attorney, Agent, or Firm*—Paul Im

(57) ABSTRACT

Physical barriers (210) are present between neighbouring pixels (200) on a circuit substrate (100) of an active-matrix electroluminescent display device, particularly with LEDs (25) of organic semi conductor materials. The invention forms these barriers (210) with metal or other electrically-conductive material (240), that is insulated (40) from the LEDs but connected to the circuitry within the substrate (100). This conductive barrier material (240) backs-up or replaces at least a part of the drive supply line (140,240) to which the LEDs are connected by a drive element T1. This transfers the problem of line resistance and associated voltage drop from within the circuit substrate (100), where it is severely constrained, to the much freer environment of the pixel barriers (210) on the substrate (100) where the conductive barrier material (240) can provide much lower resistance. Very large displays can be made with low voltage drops along this composite drive supply line (140,240). Furthermore, the structure can be optimised to form a smoothing capacitor (Cs) between this drive supply line (140,240) with its conductive barrier material (240) and the further supply line (230) of the LED upper electrodes (23) extending on an insulating coating (40) over the top of the conductive barrier material (240).

25 Claims, 13 Drawing Sheets

U.S. PATENT DOCUMENTS

| | | |
|---|---|---|
| 6,800,872 B2* | 10/2004 | Tanaka et al. ................ 257/59 |
| 6,872,975 B2* | 3/2005 | Murade ........................ 257/59 |
| 2001/0007413 A1 | 7/2001 | Battersby ................. 315/169.3 |
| 2002/0044124 A1* | 4/2002 | Yamazaki et al. ............ 345/92 |
| 2002/0047568 A1* | 4/2002 | Koyama .................. 315/169.3 |
| 2002/0190329 A1* | 12/2002 | Arai et al. .................. 257/383 |
| 2003/0085404 A1* | 5/2003 | Kim et al. .................... 257/72 |
| 2003/0127652 A1* | 7/2003 | Park et al. .................... 257/72 |
| 2003/0197177 A1* | 10/2003 | Baek et al. ................... 257/59 |

FOREIGN PATENT DOCUMENTS

| | | |
|---|---|---|
| EP | 1096568 A2 | 5/2001 |
| EP | 1102317 A2 | 5/2001 |
| GB | 2347017 B | 1/2004 |
| KR | 1997/53375 U | 10/1997 |
| KR | 2001/0099097 | 11/2001 |
| WO | WO9943031 A1 | 8/1999 |
| WO | WO0101383 A1 | 1/2001 |
| WO | WO0101384 A1 | 1/2001 |

* cited by examiner

ACTIVE MATRIX ELECTROLUMINESCENT DISPLAY DEVICES, AND THEIR MANUFACTURE

This invention relates to active-matrix electroluminescent display devices, particularly but not exclusively using light-emitting diodes of semiconducting conjugated polymer or other organic semiconductor materials. The invention also relates to methods of manufacturing such devices.

Such active-matrix electroluminescent display devices are known, comprising an array of pixels that is present on a circuit substrate, wherein each pixel comprises a current-driven electroluminescent element, typically of organic semiconductor material.

In many such arrays, physical barriers of insulating material are present between neighbouring pixels in at least one direction of the array. Examples of such barriers are given in published United Kingdom patent application GB-A-2 347 017, published PCT patent application WO-A1-99/43031, published European patent applications EP-A-0 895 219, EP-A-1 096 568, and EP-A-1 102 317, the whole contents of which are hereby incorporated herein as reference material.

Such barriers are sometimes termed "walls", "partitions", "banks", "ribs", "separators", or "dams", for example. As can be seen from the cited references, they may serve several functions. They may be used in manufacture to define electroluminescent layers and/or electrode layers of the individual pixels and/or of columns of pixels. Thus, for example, the barriers prevent pixel overflow of conjugate polymer materials that may be ink-jet printed for red, green and blue pixels of a colour display or spin-coated for a monochrome display. The barriers in the manufactured device can provide a well-defined optical separation of pixels. They may also carry or comprise conductive material (such as upper electrode material of the electroluminescent element), as auxiliary wiring for reducing the resistance of (and hence the voltage drops across) the common upper electrode of the electroluminescent elements.

Each electroluminescent element of an active-matrix display device is connected in series with a drive element (typically a thin-film transistor, hereafter termed "TFT") between two voltage supply lines of the array. These two supply lines are typically a power supply line and a ground line (also termed "return line"). Light emission from the electroluminescent element, typically a LED, is controlled by the current flow therethrough, as altered by its respective drive element TFT. The supply line to which the electroluminescent elements are connected by their series drive elements may be termed the "drive supply line" or "drive line" or "current drive line" of the pixels. Voltage drops along these two supply lines can result in incorrect drive currents for individual pixels. This can lead to a decrease in emission intensity (i.e. fading of the image) from pixels in the centre of the display. Indeed, with large-area displays, the effect may be so bad that no emission occurs at the centre, so limiting the acceptable display size.

Several measures have been proposed in order to reduce such voltage drops and/or their effects for a row of pixels. Thus, it is known from published U.S. patent application US-A1-2001/0007413 (Philips ref: PHGB000001) to reduce voltage drops along the line by tapering the width of the line. Published PCT patent applications WO-A1-01/01383 and WO-A1-01/01384 (Philips refs: PHB34350 & PHB34351) adopt a different approach in which error values are generated to correct the drive signals for each pixel. The whole contents of US-A1-2001/0007413, WO-A1-01/01383 and WO-A1-01/01384 are also hereby incorporated herein as reference material.

It is an aim of the present invention to reduce such voltage drops along the drive supply line, and to do so in a manner that does not significantly complicate the device structure, its layout and its electronics.

According to one aspect of the present invention, there is provided an active-matrix electroluminescent display device with the features of Claim 1.

In accordance with the invention, the physical barriers between pixels are partly and/or predominantly of electrically-conductive material (typically metal) that is insulated from the electroluminescent elements and that provides at least a part of the drive supply line. This conductive barrier material may form a conductive core of the barrier. It is connected into the circuit substrate, to electrode connections for the respective drive elements, via contact windows (hereinafter termed "vias") between the pixel barriers and the drive elements in the substrate. Thus, the problem of line resistance and associated voltage drop is transferred from within the circuit substrate (where it is severely constrained) to the much freer environment of the pixel barriers oh the substrate (where the conductive barrier material can provide much lower resistance).

By this means, the electrical resistance along the drive supply line (and consequential voltage drops) can be significantly reduced, as compared with a is conductor layer within the circuit substrate, for example a thin-film electrode line of the drive element. Thus, along this drive line, the conductive barrier material has a cross-sectional area that is typically larger (for example, at least twice as large as, or even at least an order of magnitude larger) than that of a thin conductor layer in the circuit substrate. As such, the resistance (even of long lines) can be low, and very large electroluminescent displays can be constructed in accordance with the invention. Even with smaller displays, the image quality can be improved by use of the conductive barrier material in accordance with the present invention.

By providing one via per pixel, continuous barrier lines of conductive material on the circuit substrate can be used to replace the drive lines that were previously incorporated within the circuit substrate. This permits an increase in pixel aperture. The conductive barrier line itself may simply overlap with a column or row conductor line of the array. Alternatively, lines (or individual lengths) of the conductive barrier material may be used to back-up corresponding lengths of a drive line of the circuit substrate. This alternative provides greater choice in the number and location of the vias.

The design of such a device structure in accordance with the invention may also be optimised to include a smoothing capacitor between the two voltage supply lines of the electroluminescent element. The insulation of the conductive barrier material from the electroluminescent elements can form a capacitor dielectric of this smoothing capacitor. This insulation may be in the form of a coating on the sides and top of the conductive barrier material. Typically, the said further supply line (for the upper electrode of the electroluminescent element) may extend on this insulating coating over the top of the conductive barrier material. Thus, a smoothing capacitor for the power supply can be readily realized between the drive line that comprises the conductive barrier material and the further supply line that comprises upper electrodes of the electroluminescent elements.

It is advantageous for the physical barriers to extend as a network of conductive barrier material between pixels in both row and column directions is of the array. Such a network of conductive barrier material can serve to reduce resistance between drive line areas across the array. It can also provide a design option in determining the capacitance value of the smoothing capacitor for the power supply to the electroluminescent elements.

However, the physical barriers may extend between pixels in just one direction of the array, for example in a column or row direction. In this case, additional insulated barriers of conductive barrier, material may be provided in the transverse direction for a different purpose, for example to back-up a row or column line. These additional insulated barriers may even be constructed to form an additional component, for example a holding capacitor at each pixel.

According to another aspect of the present invention, there are also provided advantageous methods of manufacturing such an active-matrix electroluminescent display device in accordance with the first aspect. The method may include the steps of:

(a) opening contact windows in the intermediate insulating layer on the circuit substrate to expose electrode connections for respective drive elements of at least some of the pixels;

(b) forming the physical barriers on the circuit substrate with insulation at least at the sides of the physical barriers adjacent to the pixel areas; and (c) providing the electroluminescent elements in the pixel areas in between the physical barriers, wherein the conductive barrier material is provided by depositing electrically-conductive material at least for connection at the contact windows of the intermediate insulating layer.

Various processes may advantageously be used to deposit and form the barrier material(s) and to insulate the conductive barrier material.

Various advantageous features and feature-combinations in accordance with the present invention are set out in the appended Claims. These and others are illustrated in embodiments of the invention that are now described, by way of example, with reference to the accompanying diagrammatic drawings, in which:

Figure 1:
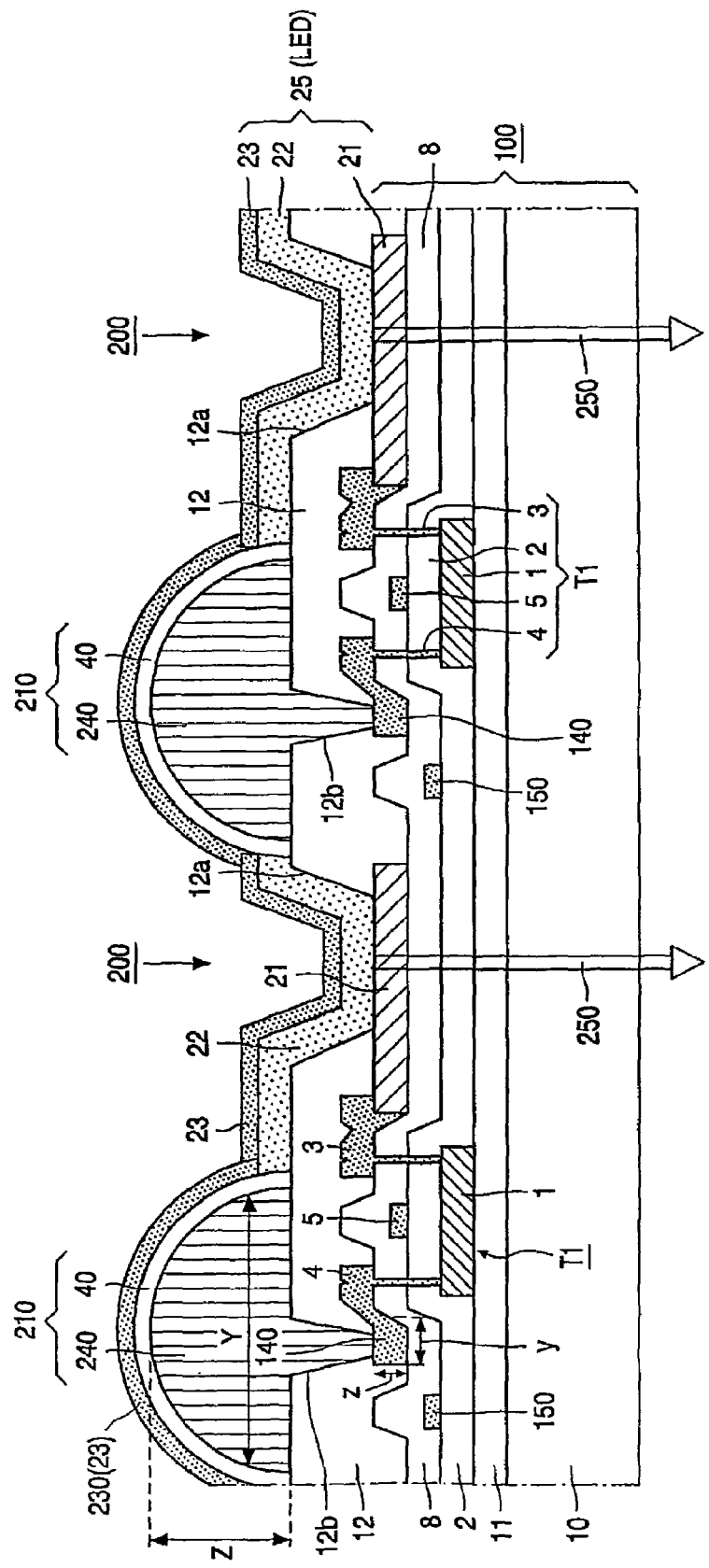
FIG. 1 is a cross-sectional view of part of a pixel array and circuit substrate of an active-matrix electroluminescent display device (that has conductive barriers forming at least part of a drive line) as one particular embodiment of the invention.

It should be noted that all the Figures are diagrammatic. Relative dimensions and proportions of parts of these Figures have been shown exaggerated or reduced in size, for the sake of clarity and convenience in the drawings. The same reference signs are generally used to refer to corresponding or similar features in modified and different embodiments.

Embodiments of FIGS. 1 to 4

The active-matrix electroluminescent display device of FIG. 1 comprises an array of pixels 200 on a circuit substrate 100. Each pixel 200 comprises a current-driven electroluminescent element 25 (21,22,23) that is connected to a supply line 140,240 by a current-controlling series drive element T1 (1–5) in the circuit substrate 100. This series element T1, typically a TFT, controls the current through the electroluminescent element 25 (21,22,23). As described below, the display can be very large in area due to the construction of these current drive lines 140,240 using conductive barrier material 240 in accordance with the present invention. Apart from this construction of the drive supply lines 140,240 in accordance with the present invention, the display may be constructed using known device technologies and circuit technologies, for example as in the background references cited hereinbefore.

Thus, the electroluminescent element 25 typically comprises a light-emitting diode (LED) of organic semiconductor material 22 between a lower electrode 21 and an upper electrode 23. In a preferred particular embodiment, semi-conducting conjugated polymers may be used for the electroluminescent material 22. For a LED that emits its light 250 through the substrate 100, the lower electrode 21 may be an anode of indium tin oxide (ITO), and the upper electrode 23 may be a cathode comprising, for example, calcium and aluminium. FIG. 1 illustrates a LED construction in which the lower electrode 21 is formed as a thin film in the circuit substrate 100. The subsequently-deposited organic semiconductor material 22 contacts this thin-film electrode layer 21 at a window 12a in a planar insulating layer 12 (for example of silicon nitride) that extends over the thin-film structure of the substrate 100.

Figure 3:
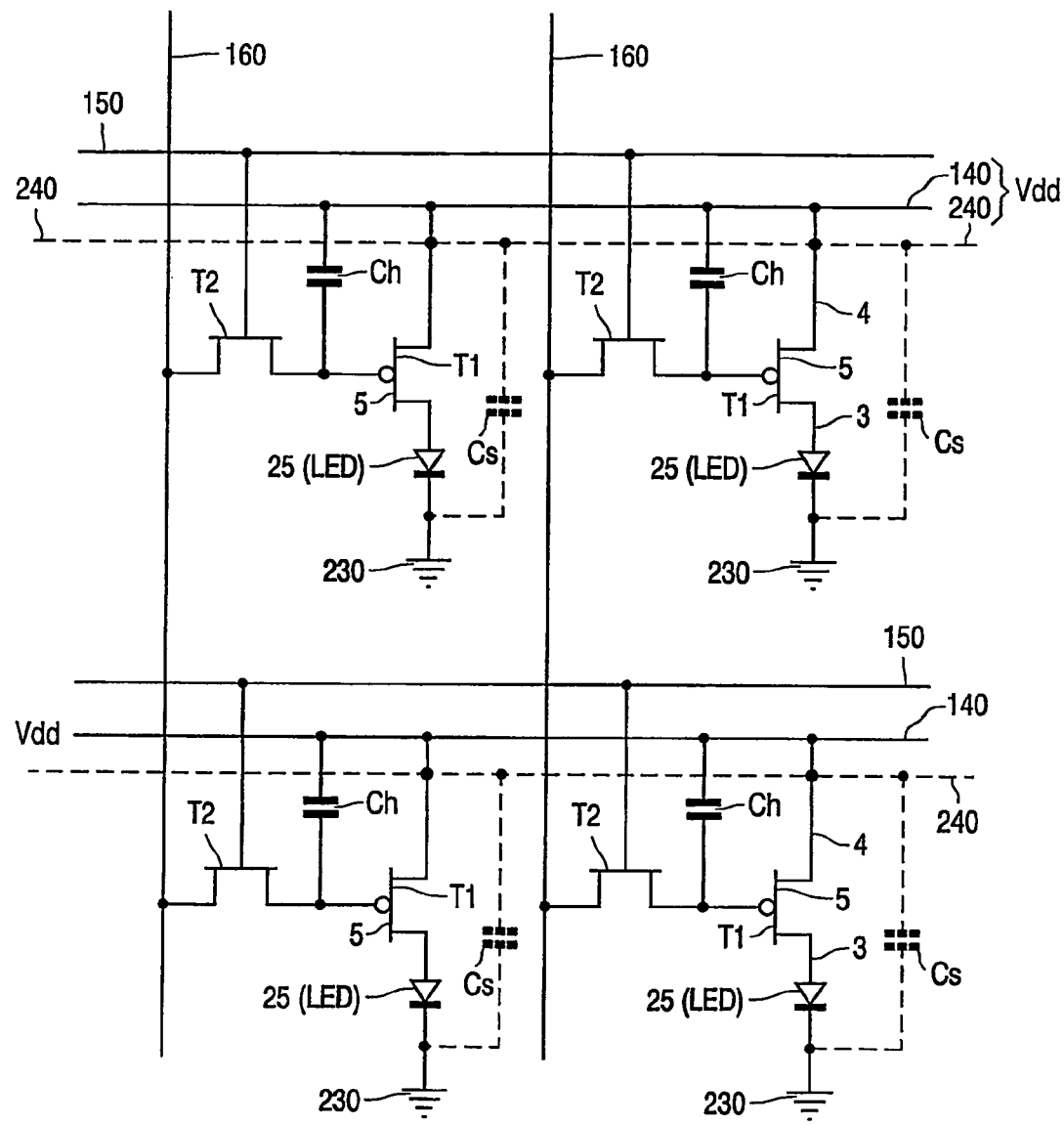
FIG. 3 is circuit diagram for four such pixel areas of such a device in accordance with the invention.

As illustrated in FIGS. 1 and 3, the LED 25 and its drive element T1 are connected in series between a pair of voltage supply lines 140,240 and 230. The line 140,240 (to/from which the drive elements T1 control the LED connection, and hence the current flow) is termed the drive line. The other line 230 is connected directly to the LED 25. Thus, in the particular embodiment of FIG. 1, the line 230 is formed as a common extension of the upper electrodes 23 of the pixels 200. In the circuit configuration of FIG. 3, the line 230 is grounded and so forms a return line, whereas voltage Vdd is applied to the line 140,240 as a power supply line.

The series drive element T1 typically comprises a TFT that is formed as part of a thin-film circuit within the substrate 100. The substrate 100 may have an insulating glass base 10 on which an insulating surface-buffer layer 11, for example, of silicon dioxide is deposited. The thin-film circuitry is built up on the layer 11 in known manner. Thus, in addition to TFT T1, the circuit substrate 100 typically includes other drive and matrix addressing circuitry, for example with thin-film elements T2, Ch, 140, 150 and 160 as illustrated in FIG. 3. It should be understood that FIG. 3 depicts, by way of example, one specific pixel circuit configuration. Other pixel circuit configurations are known for active matrix electroluminescent display devices. It should readily be understood that the present invention may be applied to the pixel barriers of such a device regardless of the specific pixel circuit configuration of the device.

As illustrated in FIG. 3, the pixel circuit comprises addressing TFTs T2 between transverse sets of row (addressing) conductors 150 and column (data) conductors 160, all of which are formed in the substrate 100. Each row of pixels is addressed in turn in a frame period by means of a selection signal that is applied to the relevant row conductor 150 (and hence to the gate of the addressing TFTs T2 of the pixels of that row). This signal turns on the addressing TFT T2, so loading the pixels of that row with respective data signals from the column conductors 160. These data signals are applied to the gate of the individual drive TFT Ti of the respective pixel. In order to hold the resulting conductive state of the drive TFT T1, this data signal is maintained on its gate 5 by a holding capacitor Ch that is coupled between this gate 5 and the drive line 140,240. Thus, the drive current through the LED 25 of each pixel 200 is controlled by the driving TFT T1 based on a drive signal applied during the preceding address period and stored as a voltage on the associated capacitor Ch. In the specific example of FIG. 3, T1 is shown as a P-channel TFT, whereas T2 is shown as an N-channel TFT.

This circuitry can be constructed with known thin-film technology. FIG. 1 illustrates the P-channel TFT T1 comprising: an active semiconductor layer 1 (typically of polysilicon); a gate dielectric layer 2 (typically of silicon dioxide); a gate electrode 5 (typically of aluminium or polysilicon); and metal electrodes 3 and 4 (typically of aluminium) which contact P-type doped source and drain regions of the semiconductor layer 1 through windows (vias) in the over-lying insulating layer(s) 2 and 8. Extensions of these metal electrodes 3 and 4 at the upper level form an interconnection between TFT electrode 3 and the lower electrode 21 of the LED and form at least a connection area 140 of the drive line 140,240. In a particular layout embodiment (such as that of FIG. 2), this extension of the metal electrodes 4 of a row may form a continuous line 140 for that row. FIG. 1 illustrates also a section through the address lines 150, which may be, for example, of aluminium or polysilicon and which may be formed from the same layer as the TFT gates 5.

Figure 4:
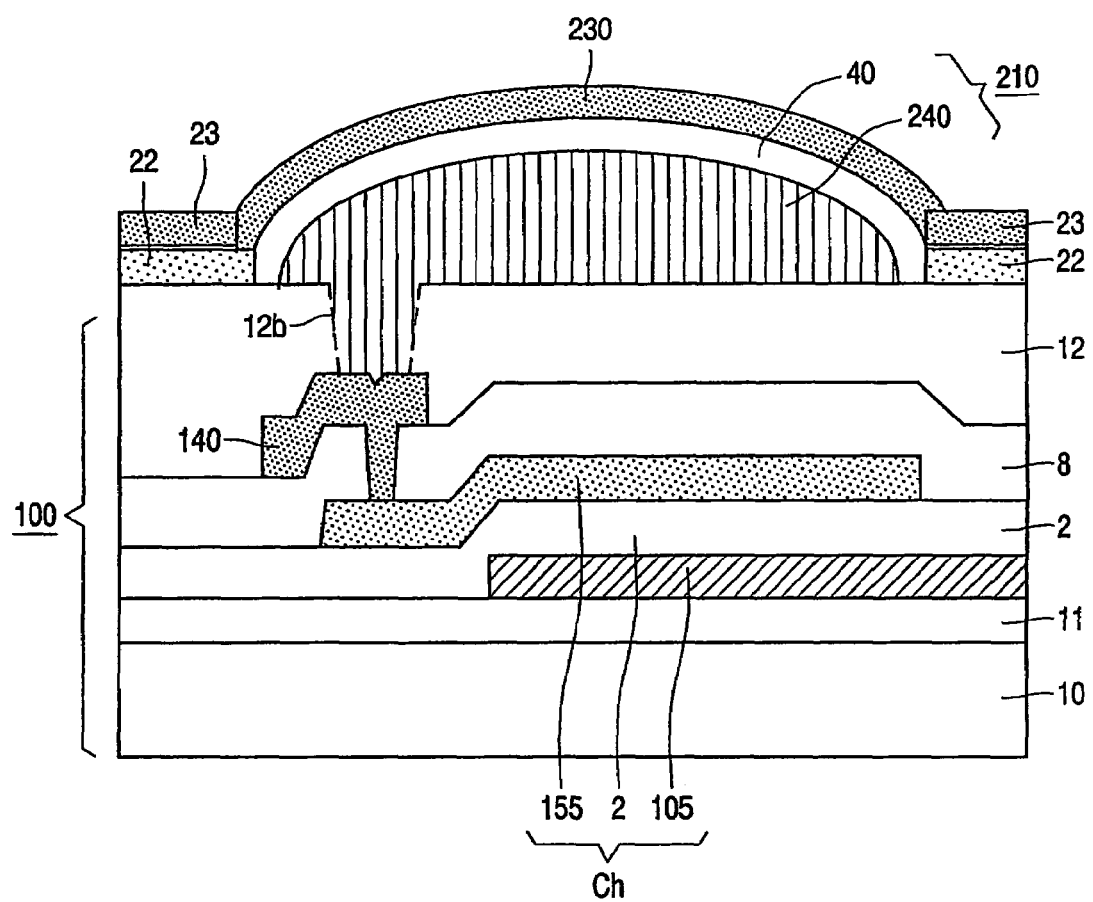
FIG. 4 is a cross-sectional view, through a holding capacitor, of part of a pixel array and circuit substrate in the same and/or another embodiment of the active-matrix display device in accordance with the invention.

The holding capacitor Ch may be formed similarly, in known manner, as a thin-film structure inside the circuit substrate 100. Thus, FIG. 4 illustrates such a capacitor Ch that comprises a thin-film conductor plate 155 on a thin-film dielectric 2 on a thin-film conductive plate 105.

As in known devices, the device(s) of FIGS. 1 to 4 in accordance with the present invention include physical barriers 210, between at least some of the neighbouring pixels in at least one direction of the array. These barriers 210 may also be termed "walls", "partitions", "banks", "ribs", "separators", or "dams", for example. Depending on the particular device embodiment and its manufacture, they may be used in known manner, for example:

to separate and prevent overflow of a polymer solution between the respective areas of the individual pixels 200 and/or columns of pixels 200, during the provision of semiconducting polymer layers 22;

to provide a self-patterning ability on the substrate surface in the definition of the semiconducting polymer or other electroluminescent layers 22 for the individual pixels 200 and/or for columns of pixels 200 (and possibly even a self-separation of individual electrodes for the pixels, for example an individual bottom layer of the upper electrodes 23);

to act as a spacer for a mask over the substrate surface during the deposition of at least an organic semiconductor material 22 and/or electrode material;

to form opaque barriers 210 for a well-defined optical separation of the pixels 200 in the array, when light 250 is emitted through the top (instead of, or as well as, the bottom substrate 100).

Whatever their specific use in these known ways, the physical barriers 210 in an embodiment of the present invention are constructed and used in a special manner. Thus, the pixel barriers 210 which are provided in accordance with the present invention are predominantly of electrically-conductive material 240 that is insulated from the LEDs 25 and that provides at least a part of the drive line 140,240. The barriers 210 comprise a bulk or core of conductive material 240 that is preferably metal (for very low resistivity, for example aluminium or copper or nickel or silver). Contact windows 12b are present in the intermediate insulating layer 12 between the barriers 210 and the substrate circuitry. The conductive barrier material 240 is connected to the electrode connections 4,140 for respective drive elements T1 of at least some of the pixels 200 at the vias provided by these windows 12b. As illustrated in FIG. 1, its source and drain electrodes connect the main current path of the current-controlling drive TFT T1 between the conductive barrier material 240 of the drive line and the lower electrode 21 of the LED 25.

These drive line connections (and/or composite nature of the drive line 140,240) with the conductive barrier material 240 serve to decrease voltage drops along the line 140,240 as it extends across the array. As a result, the displays can be made very large in area, for example at least a metre (i.e. over 30 inches) wide. Before the advent of the present invention, it was difficult (perhaps even impossible) to make very large active-matrix electroluminescent displays due to voltage errors along the drive lines when conducting current in the conducting light-emitting state. However, the present invention can also be used with advantage in smaller displays, to improve their image quality.

Thus, along the line 140,240, the conductive barrier material 240 has a cross-sectional area that is at least twice (possibly even an order of magnitude) larger than that of the conductor layer that provides the electrode connection 4, 140 to the drive element T1. Typically, the conductive barrier material 240 may have a thickness Z that is a factor of two or more (for example at least five times) larger than the thickness z of this conductor layer 140 in the circuit substrate 100. In a specific example, Z may be between 2 μm and 5 μm as compared with 0.5 μm or less for z. Typically, the conductive barrier material 240 may have a line width Y that is the same width (or even at least twice as large) as the line width y of the conductor layer 140. In a specific example, Y may be 20 μm as compared with 10 μm for y.

It is important to note a further feature that is present in this device structure, for reducing the effect of voltage variations on the supply lines 230 and 140,240. Thus, a smoothing capacitor Cs is formed between the drive line 140,240 (that comprises the conductive barrier material 240) and the further supply line 230 (that is associated with the upper electrodes 23 of the LEDs 25). As illustrated in FIG. 1, the sides and top of the conductive barrier material 240 are coated with an insulating layer 40. The thickness and dielectric properties of this insulating coating 40 can be chosen to form a capacitor dielectric of the smoothing capacitor Cs. The other plate of the capacitor Cs is formed by the supply line 230 (comprising and/or connecting the LED upper electrodes 23), that extends on this insulating coating 40 over the top of the conductive barrier material 240. Typically, this insulating coating 40 may be of silicon dioxide or nitride or of aluminium oxide and have a thickness in the range of 10 nm (nanometres) to 0.5 μm (micrometers).

Figure 2:
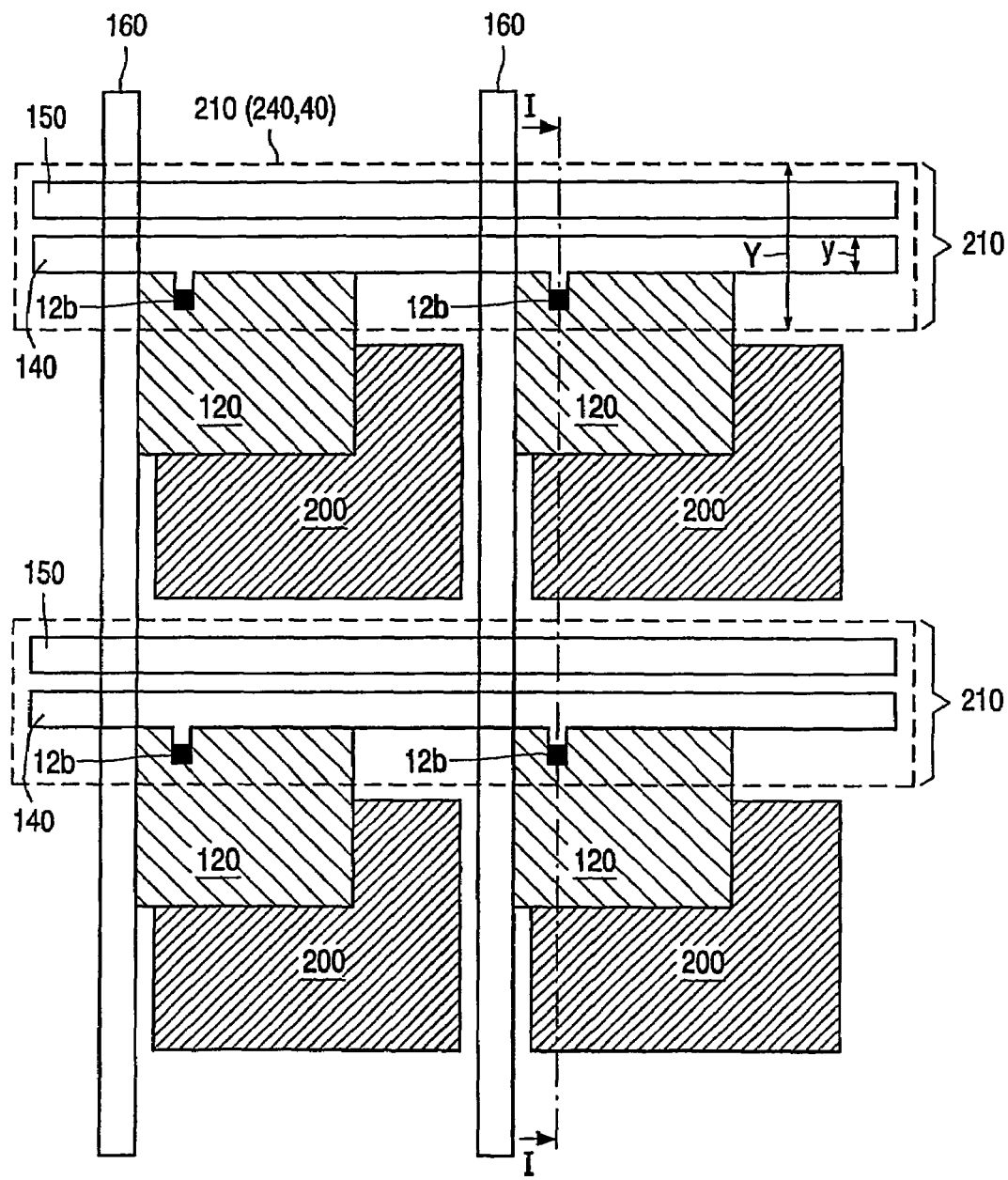
FIG. 2 is a plan view of four pixel areas (showing a specific example of layout features for the conductive barriers of such a device in accordance with the invention), the cross-section of FIG. 1 being taken on the line I—I of FIG. 2.

Layout Embodiment of FIG. 2

In the specific layout example of FIG. 2, the extensions of the TFT electrodes 4 of a pixel row form a continuous line 140 for that row. This line 140 extends parallel to barriers 210(240,40). These barriers 210 (shown in broken outline in FIG. 2) extend parallel to the address (row) conductors 150 of the substrate 100.

As illustrated in FIG. 2, when the barriers 210(240,40) extend parallel to one or more lines (such as lines 140 and 150 in FIG. 2), these lines may be fully overlapped by the barriers 120. Indeed the width Y of the barriers 210 (240,40) of FIG. 2 is so large as to overlap both the lines 140 and 150. Nonetheless, the thin-film pixel circuitry of FIG. 3 may encroach somewhat into the pixel area as illustrated by the hatched circuit area 120.

The conductive barrier material 240 is connected at the vias 12b to a node of the drive element T1 and one plate of the holding capacitor Ch. FIG. 2 illustrates an embodiment in which each pixel 200 has a respective via 12b between the conductive barrier material 249 and the electrode connection 140,4 for the respective drive element T1 of the pixel.

In the FIGS. 1 and 2 illustration, at least most of the drive element T1 is located below the conductive barrier material 240. The width Y and length of the conductive barrier material 240 permits at least most of the holding capacitor Ch to be located below the conductive barrier material 240, for example in the FIGS. 2 and 4 illustration. The drive element Ti of each pixel may have its respective electrode 4 located at a/the via 12b and/or the respective capacitor plate 155 may be located at a/the via 12b.

Each barrier 210(240,40) of the FIG. 2 layout may extend across the whole array. Thus, it may form a continuous supply line of the conductive barrier material 240 that is connected to electrode connections 4,140 for the respective drive elements T1 of the respective pixels 200. In this case, it may parallel the line 140. However, if the line resistance of the conductive barrier material 240 is itself sufficiently low, it can simply, replace the substrate conductor line 140. Thus, it is not necessary for the extensions 140 of the TFT electrodes 4 to form a continuous line, and an increase in pixel aperture can be achieved by omitting lengths of the line 140 in most of the pixel area.

Figure 5:
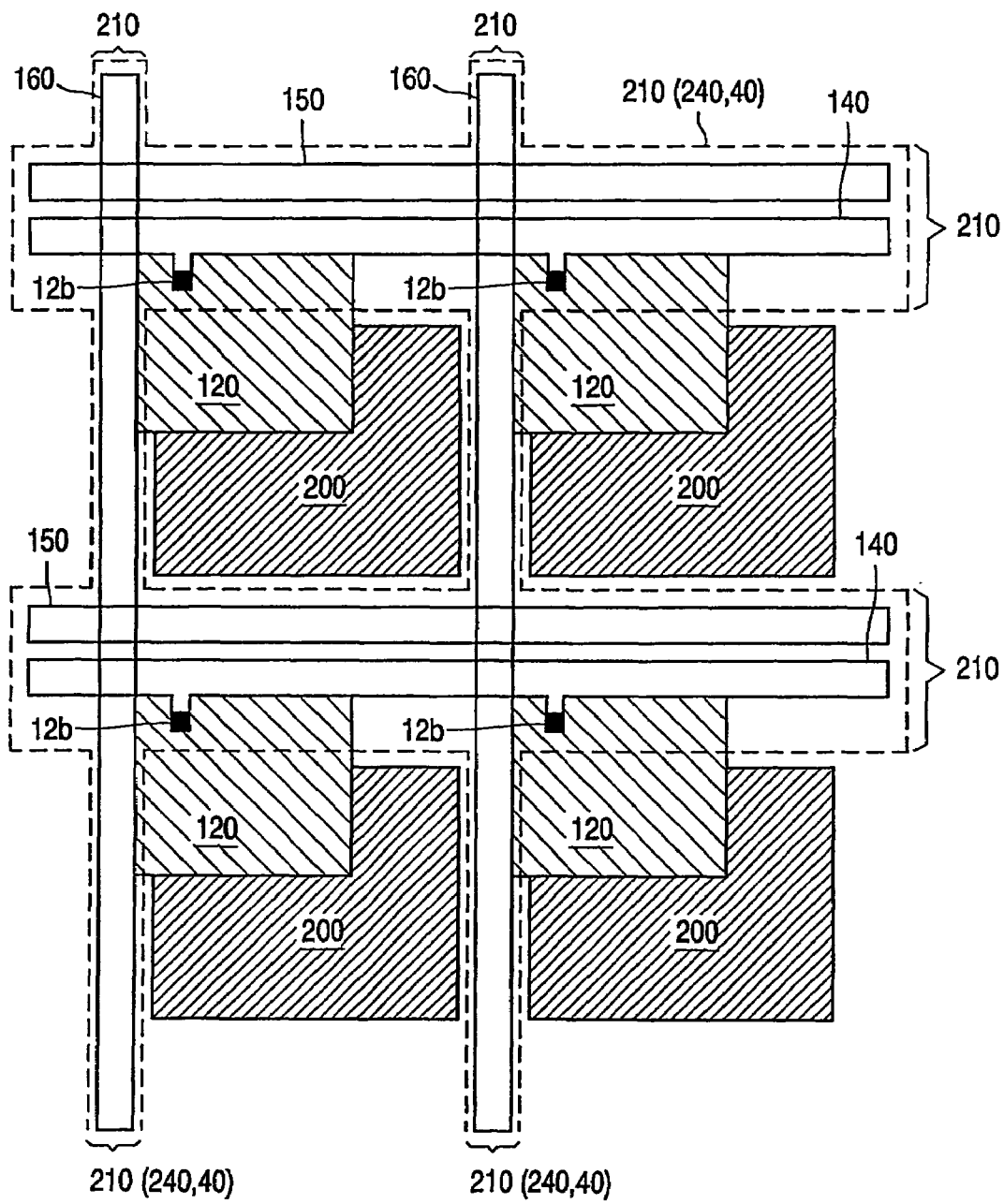
FIG. 5 is a plan view similar to FIG. 2, but showing an example of a network layout feature for the conductive barriers of the drive line of a further device embodiment in accordance with the invention.

Layout Embodiment of FIG. 5

The specific layout example of FIG. 5 is a modification of that of FIG. 2. In this modification, the barriers 210(240,40) extend in both row and column directions of the array. Thus, in this particular embodiment, the barriers 210(240,40) are interconnected between pixels to form a network of conductive barrier material 240 in both the row and column directions.

There are several potential advantages in adopting such a network of the conductive barrier material 240, as compared with separate parallel lines. Thus, the network of conductive barrier material 240 is effectively an apertured sheet conductor, in which the resistance between any two points is lower than in the FIG. 2 layout. It can also provide a design any two in determining the capacitance value of the smoothing capacitor Cs for the power supply to the LEDs 25.

Figure 6:
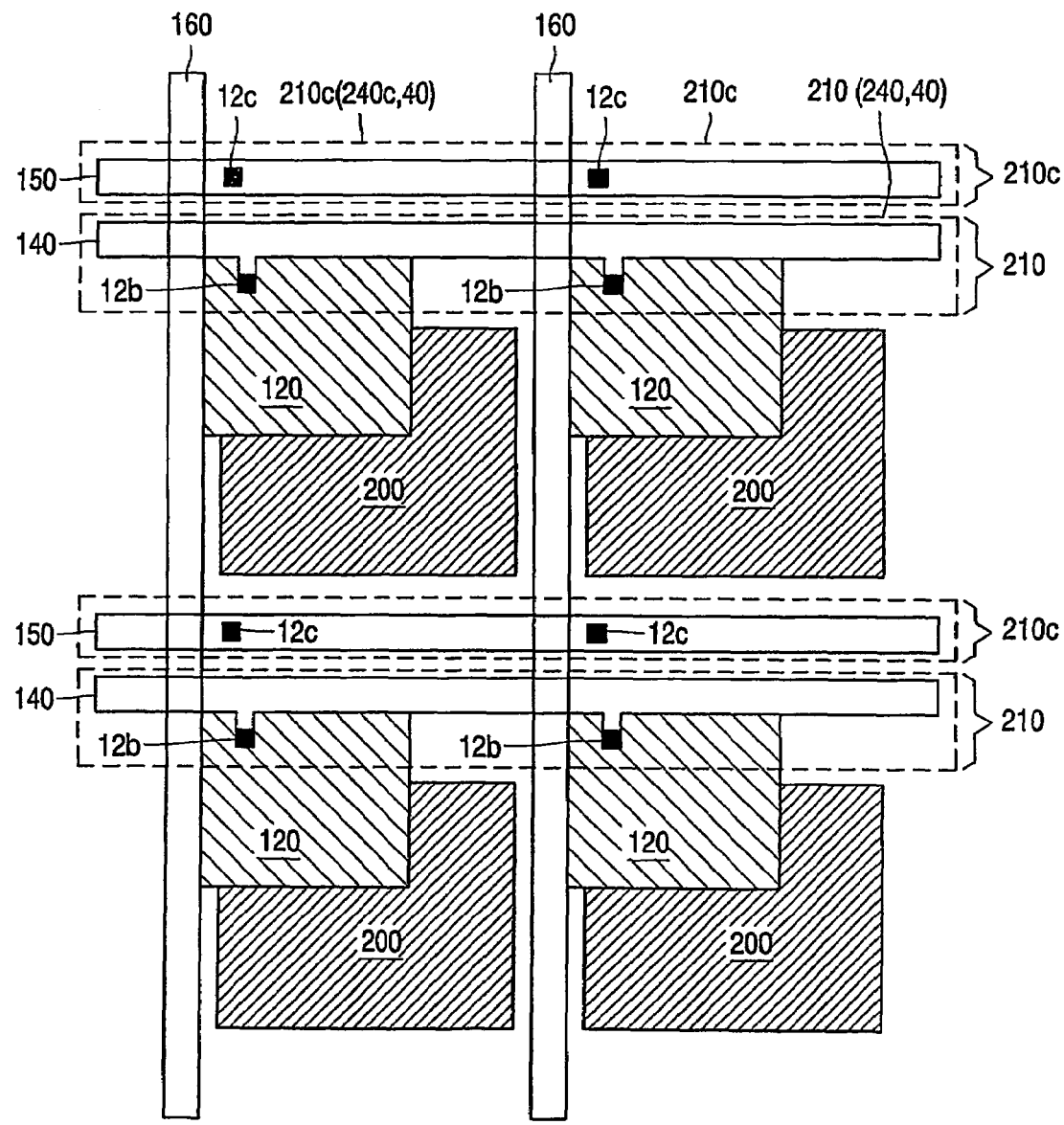
FIGS. 6 and 7 are plan views similar to FIG. 2, showing two examples of different layout features for the conductive barriers of other devices in accordance with the invention, with back-up for row conductors as well as the drive line.
Figure 7:
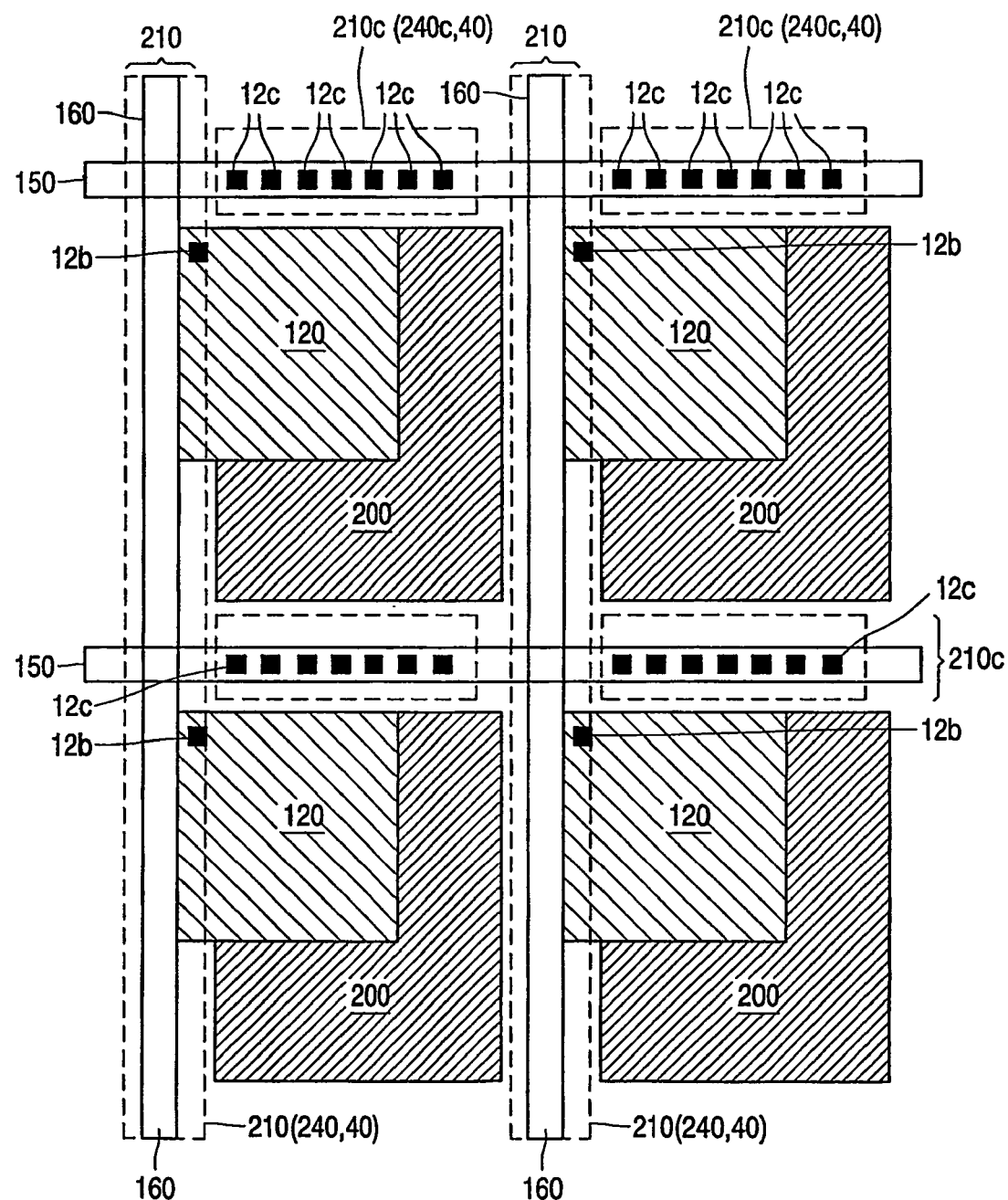

Layout Embodiments of FIGS. 6 and 7

Reduction of voltage drops along the addressing (row) lines 150 is also desirable in large arrays. FIGS. 6 and 7 illustrate how additional barriers 210c that are of the same construction as barriers 210 (i.e. predominantly of the conductive barrier material 240) may be used for this purpose. The specific layout examples of FIGS. 6 and 7 are given as modifications of that of FIG. 2. In each case, the pixel barriers 210 that provide at least the low-resistance part 240 of the drive line 140,240 are also retained in the device.

The additional barriers 210c of conductive material 240 extend parallel to the row conductors 150, as shown in FIGS. 6 and 7. They are connected at additional vias 12c in the intermediate insulating layer 12 to the row conductors 150 in the circuit substrate 100 to reduce voltage drops along the row conductors 150. As such, these additional barriers 210c back-up parts of the row lines 150, to reduce their resistance. They are insulated from the barriers 210 that form at least part of the drive line 140,240.

In the FIG. 6 modification, the additional barriers 210c that back-up the row lines 150 extend parallel to the barriers 210 that provide at least the low-resistance part 240 of the drive line 140,240. Thus, these barriers 210 and 210c both extend in the same direction between pixels 200 of the array.

In the FIG. 7 modification, the barriers 210 extend parallel to the column conductors 160. They provide a continuous low resistance drive line 240 replacing the line 140, as in FIG. 8. Such a modification could be made to the display devices of FIGS. 1 to 4 without including additional barriers 210c for the row lines 150. However, FIG. 7 illustrates a layout that includes the additional barriers 210c to back-up the row lines 150. In this embodiment, the additional barriers 210c extend transverse to the barriers 210 of the drive line 140,240. Thus, barriers 210 extend in one direction of the array, and barriers 210c extend in the transverse direction. The barriers 120 and 120c thus form a network between pixels of the array. However, unlike FIG. 5, the conductive barrier material 240 in the transverse direction (barriers 210c) of the network is insulated from that in the other direction (barriers 210).

Figure 8:
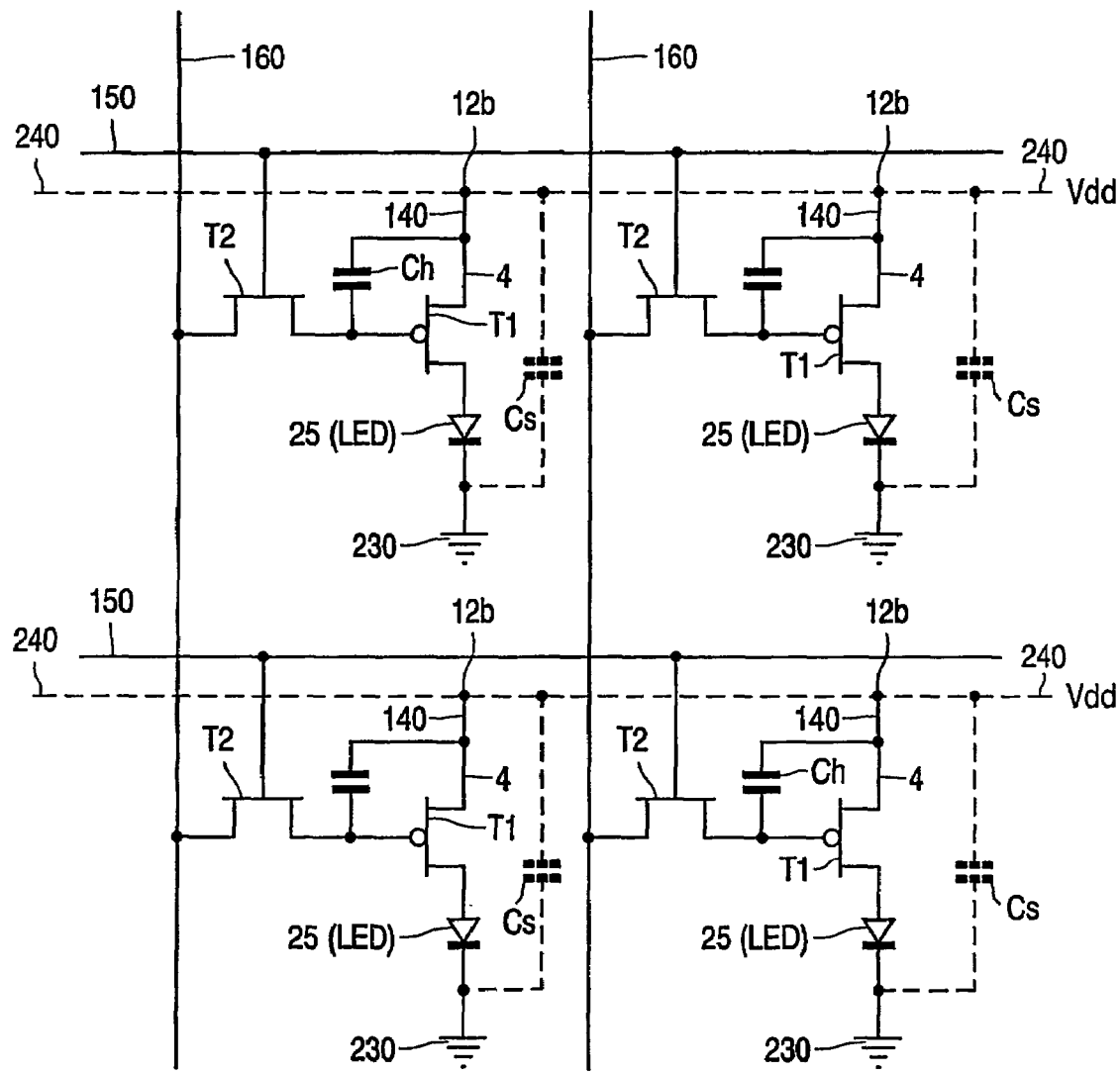
FIGS. 8 and 9 are circuit diagrams for two modified pixel-drive configurations of a pixel area of two further devices in accordance with the invention.

Circuit Embodiment of FIG. 8

As mentioned above with respect to FIG. 2, the extensions 140 of the TFT electrodes 4 need not form a continuous line, when the barrier 210(240,40) itself provides a continuous line of the conductive barrier material 240. Thus, the continuous line of the conductive barrier material 240 may replace the line 140 of the circuit substrate 100. Such a scenario is illustrated in the circuit diagram of FIG. 8. The continuous line of the conductive barrier material 240 is connected to the electrode connections 140 for the respective drive element T1 and holding capacitor Ch of all the respective pixels 200 of a row. Each of the pixels 200 is provided with a respective via 12b between its electrode connection 140 and the conductive barrier material 240.

Figure 9:
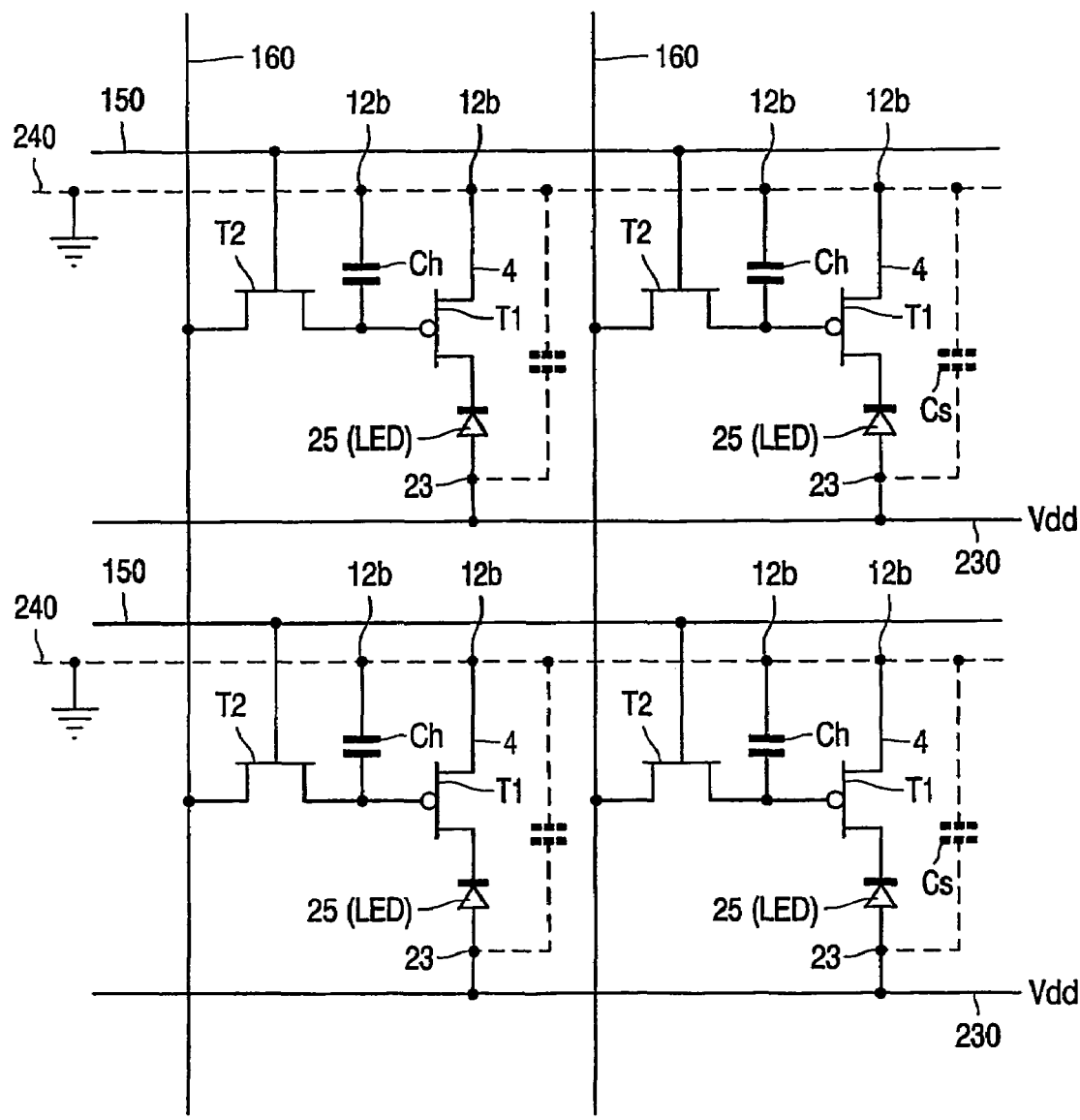

Circuit Embodiment of FIG. 9

In the embodiments so far described with reference to FIGS. 1 to 8, the line 230 is grounded and so forms a return line, whereas voltage Vdd is applied to the line 140,240 as a power supply line. FIG. 9 illustrates an alternative configuration in which line 140,240 (that comprises the conductive barrier material 240) is grounded and so forms the return line. In this case, the drive voltage Vdd is applied to line 230 (that comprises or is connected to the upper electrode 23 of the LED 25). Thus, the line 230 is now the power supply line.

Furthermore, the upper electrode 23 of the LED 25 is now of anode material, whereas the lower electrode 23 is now formed of cathode material. Such a display may, for example, emit its light 250 through the top surface rather than through the substrate 100. The light-emitting layer 22 may be of, for example, molecular (small molecule) organic semiconductor material, or it may be of a semiconducting polymer.

However, as in the previous embodiments, the conductive barrier material 240 forms part of the drive line, i.e. the line to which the LED 25 is connected via the drive element T1.

Figure 10:
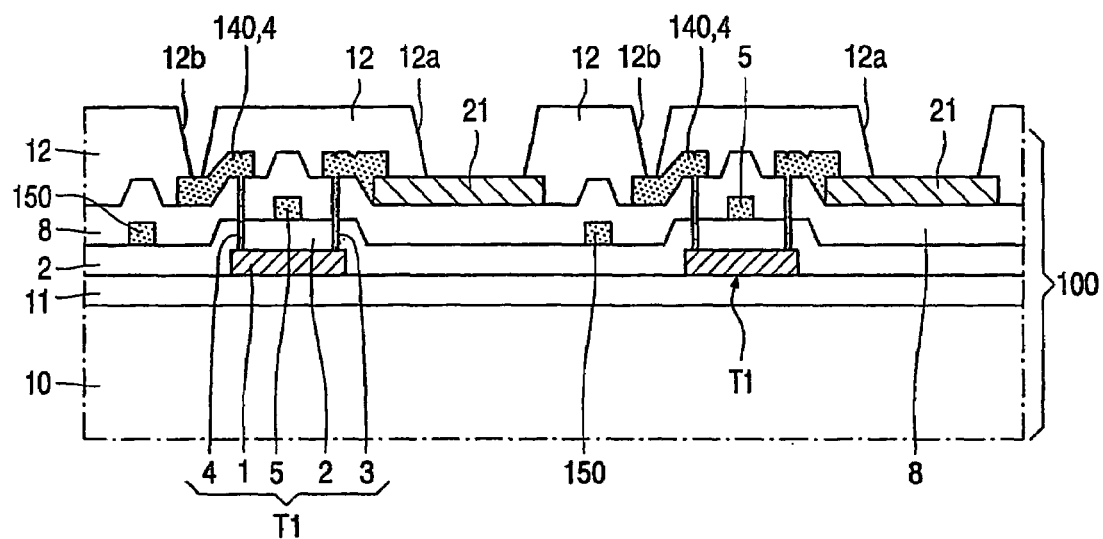
FIGS. 10 to 12 are sectional views of a device part such as that of FIG. 1 at stages in its manufacture with one particular embodiment in accordance with the invention.
Figure 11:
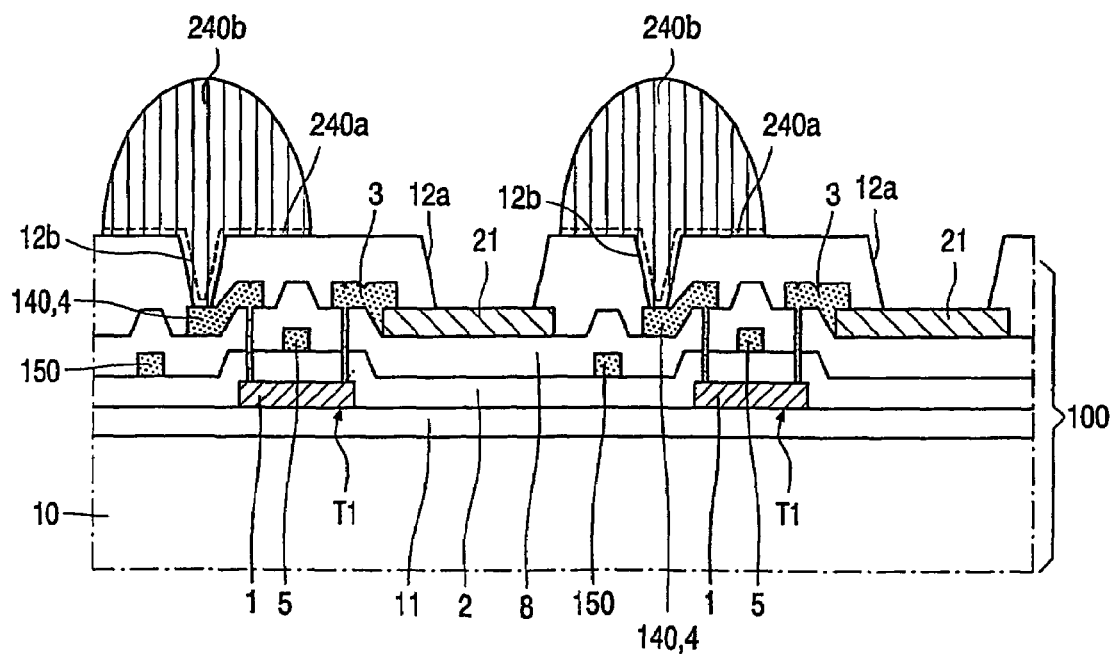
Figure 12:
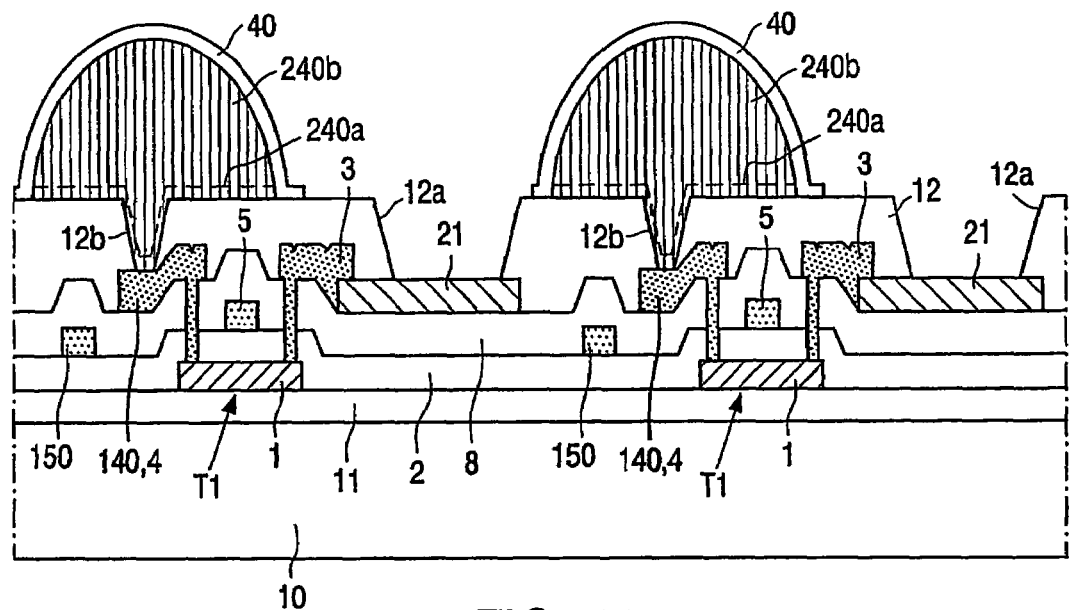

Process Embodiment of FIGS. 10 to 12

Apart from the construction of the drive lines 140,240, an active-matrix electroluminescent display device in accordance with the present invention may be constructed using known device technologies and circuit technologies, for example as in the cited background references.

FIGS. 10 to 12 illustrate novel process steps in a particular manufacturing embodiment. The thin-film circuit substrate 100 with its upper planar insulating layer 12 (for example, of silicon nitride) is manufactured in known manner. Contact windows (such as vias 12a, 12b, 12c etc.) are opened in the layer 12 in known manner, for example by photolithographic masking and etching. However, in order to manufacture a device in accordance with the present invention, the pattern of these vias include the vias 12b that expose electrode connections 140,4 of respective drive elements T1 for at least some of the pixels 200. The resulting structure is illustrated in FIG. 10.

Thereafter electrically-conductive material for the barriers 210 is deposited on the insulating layer 12 at least in its vias 12a, 12b, 12c etc. The desired layout for the barriers 210 (for example, as in FIGS. 2, 5, 6, or 7) is obtained using known masking techniques. FIG. 11 illustrates an embodiment in which at least the bulk 240b of the conductive barrier material (for example, copper or nickel or silver) is deposited by plating. In this case, a thin seed layer 240a of, for example, copper or nickel or silver is first deposited over the insulating layer 12 and its vias 12a, 12b, 12c etc, the barrier layout pattern is defined with a photolithographic mask, and then the bulk 240b of the conductive barrier material is plated to the desired thickness Z. The resulting structure is illustrated in FIG. 11.

Then, using CVD (chemical vapour deposition), insulating material (for example silicon dioxide or silicon nitride) is deposited for the insulating coating 40. The deposited material is left on the sides and top of the conductive barrier material by patterning using known photolithographic masking and etching techniques. The resulting structure is illustrated in FIG. 12.

Thereafter the manufacture is continued in known manner. Thus, for example, conjugate polymer materials may be ink-jet printed or spin-coated for the pixels 200. The barriers 240,40 with their insulating coating 40 can be used in known manner to prevent polymer overflow from the pixel areas in between the physical barriers 240,40. Thereafter the upper electrode material is 23, 230 can be deposited.

Figure 13:
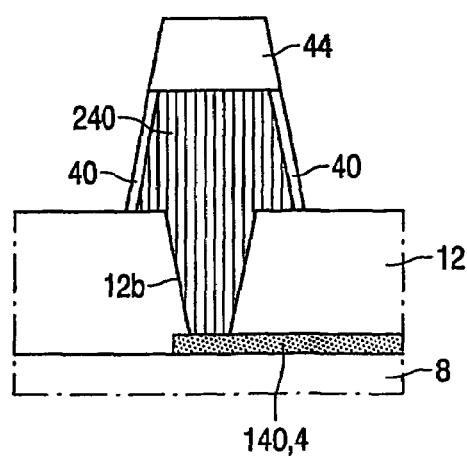
FIG. 13 is a sectional view a device part at the FIG. 12 stage, illustrating a modification in the insulation of the conductive barriers of the drive line that is also in accordance with the present invention.

Modified Process Embodiment of FIG. 13

This embodiment uses an anodisation treatment; (instead of deposition) to provide the insulating coating 40 at least at the sides of the barriers 210 adjacent to the pixel areas. Typically, the conductive barrier material 240 may comprise aluminium. The desired layout pattern of the deposited aluminium (for example, as in FIGS. 2, 5, 6, or 7) can be defined using known photolithographic masking and etching techniques. FIG. 13 shows the photolithically-defined etchant-mask 44 retained on the top of the aluminium barrier pattern 240.

Then, an anodic insulating coating of aluminium oxide is formed on at least the sides of the aluminium barrier material 240 using known anodisation techniques. Thus, no extra mask is needed to define the layout for this coating 40.

If the mask 44 is removed before this anodisation, the anodic coating is formed at both the sides and top of the aluminium barrier pattern 240. However, FIG. 13 illustrates an example in which the mask 44 is retained during this anodisation, so that the anodic coating is formed at only the sides of the aluminium barrier pattern 240. In devices having the supply line 230 extending over the top of the barrier 210(240,40), then the mask 44 of an insulating polymer or, for example, silicon dioxide or nitride may be retained in the manufactured device.

Figure 14:
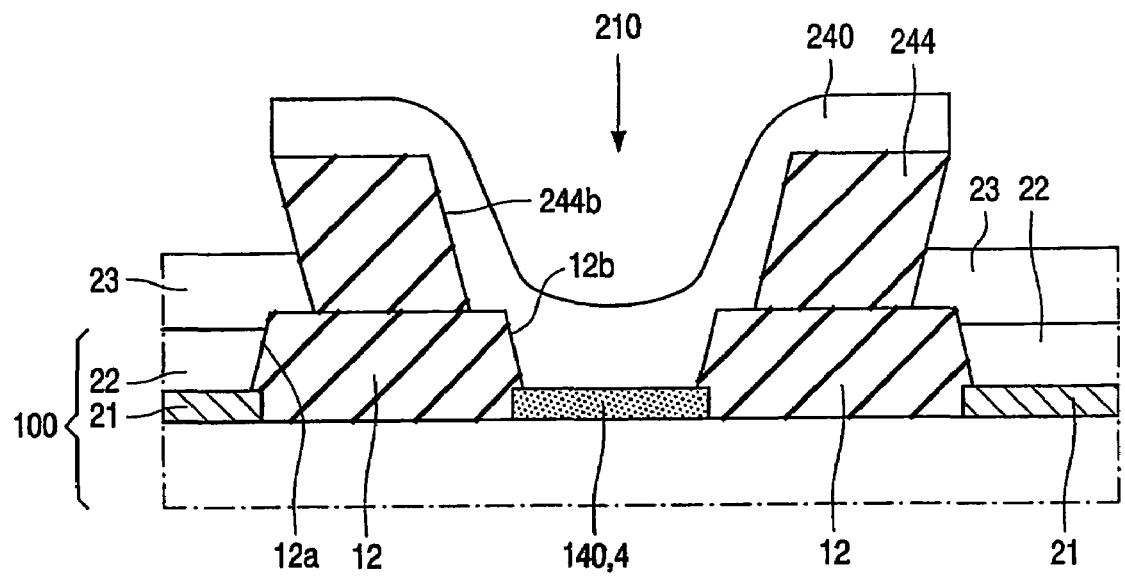
FIG. 14 is a sectional view of another embodiment of a conductive barrier construction using a metal coating to form at least part of the drive line in accordance with the invention.

Alternative Conductive Barrier Embodiment of FIG. 14

In the embodiments so far described, the barriers 210 are shown as being predominantly of conductive material 240. FIG. 14 shows a modified embodiment wherein the barrier 210 is predominantly of insulating material 244. In this case, vias 244b are etched or milled through the insulating material 244 to the electrode area 140,4 of TFT T1 in the circuit substrate 100. A metal coating 240 provides the conductive barrier material that extends on top of the insulating barrier 210 and in the vias 244b therethrough. This metal coating 240 backs up or replaces the thin-film drive supply fine 140.

The circuit substrate 100 can be formed with its planar layer 12 and vias 12a and 12b as described above with reference to FIG. 10. The insulating bulk material 244 of the FIG. 14 is then formed thereon with its via 244b. Then the metal coating 240 of this barrier 210 may be formed simultaneously with a main part of the upper electrode 23 of the LED 25, in a self-aligned manner. Thus, a layer of metal may be deposited simultaneously for the metal coating 240 and electrode 23 which are separated by a shadow-masking effect of an overhang shape in the side of the barrier 210, as illustrated in FIG. 14.

Figure 15:
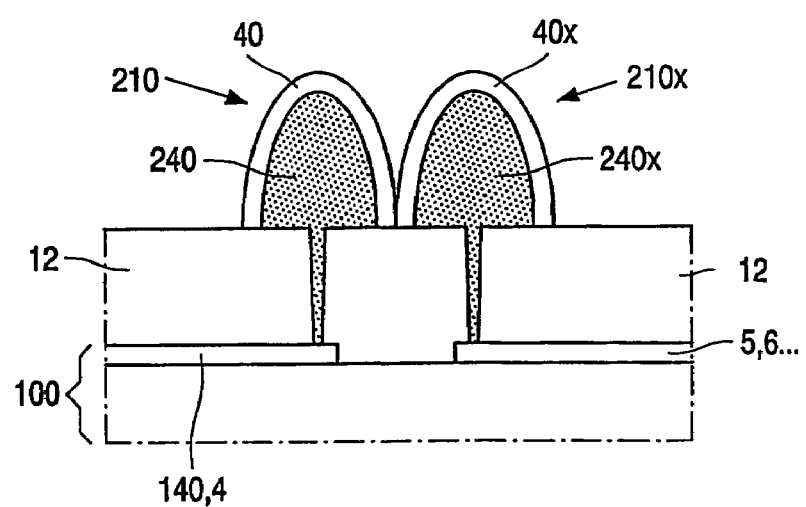
FIG. 15 is a cross-sectional view through side-by-side barriers, each with conductive barrier material that may be used in different embodiments of the invention.

Multi-conductor Barrier Embodiments of FIG. 15

FIG. 15 illustrates a composite of two side-by-side barriers 210 and 210x, each comprising a metal core 240, 240x insulated with a respective coating 40, 40x. This side-by-side multi-conductor barrier structure 210,21x can be designed and used in a variety of ways.

In one form, for example, the metal cores 240 and 240x may form (or back up) parallel drive and addressing lines 140 and 150 respectively, for example as a cross-section of the side-by-side barrier lines 140 and 150 of FIG. 6.

In another form, for example, one of the barriers 210x may be divided into insulated portions that provide an additional component, for example a capacitor as described below with reference to FIG. 17.

Figure 16:
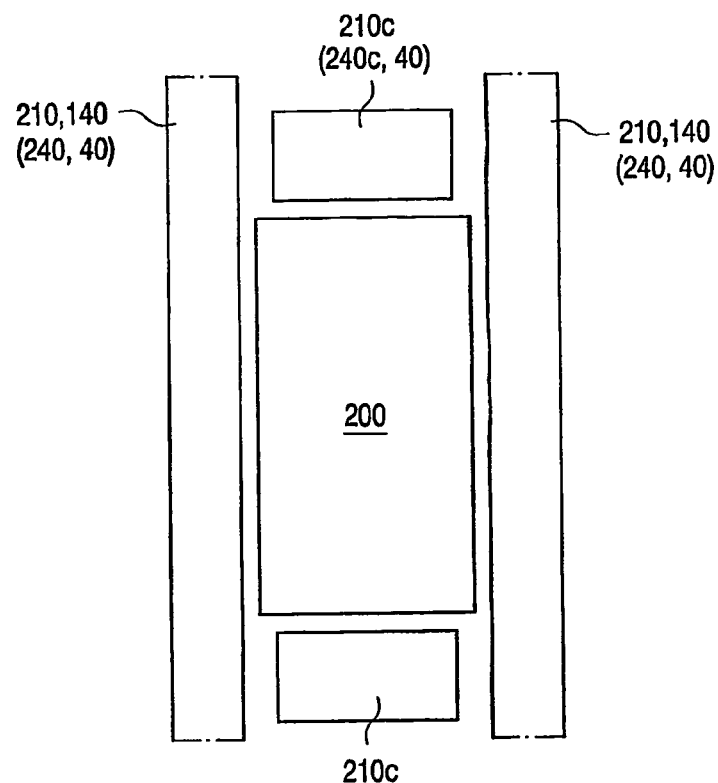
FIG. 16 is a plan view of transverse multiple barrier layout features that may be used in different embodiments of the invention.
Figure 17:
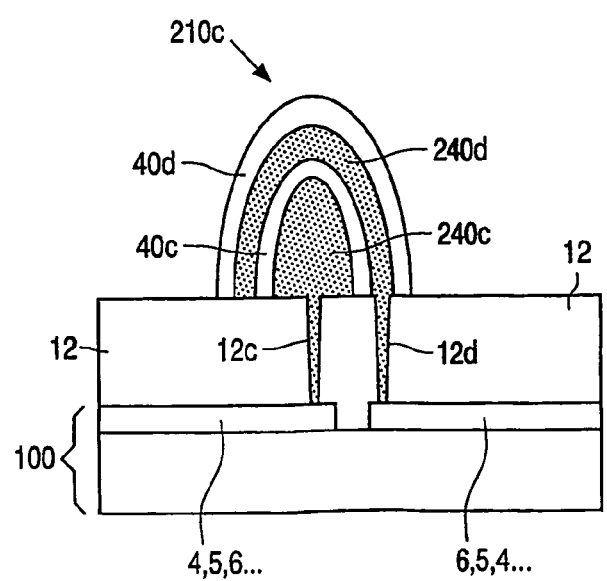
FIG. 17 is a cross-sectional view of a barrier embodiment with multiple conductive parts that may be used in different embodiments of the invention.

Multi-conductor Barrier Embodiments of FIGS. 16 and 17

The FIG. 16 embodiment is similar to that of FIG. 7, in having insulated barrier lengths 210c that extend transverse to the drive-line barriers 210, 140. These transverse barriers 210c may back up tlines 150, as described already with respect to FIG. 7. However, they may be constructed and used for other purposes.

Thus, for example, the transverse barriers 210c may themselves have a multi-conductor structure, such as that of FIG. 17. This barrier embodiment comprises a metal core 240c as the main conductive barrier material that is connected with the circuit element such as 4 or 5 etc. in the substrate 100 and that has an insulating coating 40c on thereon. However the embodiment of FIG. 17 additionally comprises a metal coating 240d that is present on the insulating coating 40c, over the top and sides of the core 240c. This metal coating 240d is connected to another circuit element of, for example, the substrate 100 such as element 6,5,4, etc.

This barrier structure of FIG. 17 is more versatile than that previously described. It permits the metal core 240c and metal coating 240d to be used for different purposes, for example, to back-up or even replace different lines 140, 150 or 160, so reducing their line resistance. The metal coating 240d may serve as a co-axial shield for the signal on the core line 240c. Alternatively, the metal coating 240d may be localised to specific locations along the barrier 210c where particular connections or components are required, for example at individual pixels or sub-pixels.

Instead of shielding, this multi-conductor structure 240c, 240d for the barrier 210c might be used to overlap two lines; for example, a back-up or replacement barrier line 140 (including core 240c) with a back-up or replacement barrier line 150 (including coating 240d). In this case, however, the thickness and dielectric properties of the insulating coating 40c need to be chosen to reduce parasitic capacitance and coupling between these lines 140 and 150.

Of particular importance is an embodiment in which the multi-conductor structure 240c, 240d of FIG. 17 is designed to form a capacitor with a capacitor dielectric 40c. Thus, separate and/or insulated lengths of the metal core 240c, insulating coating 40c and metal coating 240d may together form a capacitor connected between the substrate circuit elements 4, 5, etc.

Such a capacitor may be designed to provide, for example, the individual holding capacitor Ch for each respective pixel 200 which is connected between the supply line 140 (main electrode line 4 of TFT T1) and the gate line 5 of TFT T2 (and main electrode line 3 of TFT T1). FIG. 16 illustrates a suitable pixel layout with this holding-capacitor barrier 210c, Ch.

The FIG. 17 capacitor structure (240c, 40c, 240d) of FIG. 17 may even be connected between the lines 230 and 240 to form a smoothing capacitor, either instead of or in addition to that provided by the structure 240, 40, 230 in FIG. 1, for example.

In the embodiments described so far, the conductive barrier material 240 is a thick opaque metal, for example, aluminium, copper, nickel or silver. However, other conductive materials 240 may be used, for example a metal silicide or (less advantageously) a degenerately-doped polysilicon both of which may be surface-oxidised to form the insulating coating 40. If transparent barriers 210 are required, then ITO may be used for the conductive barrier material 240.

From reading the present disclosure, other variations and modifications will be apparent to persons skilled in the art. Such variations and modifications may involve equivalent and other features which are already known in the art (for example in the cited background references) and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

The invention claimed:

1. An active-matrix electroluminescent display device comprising a circuit substrate on which an array of pixels is present with physical barriers between neighboring pixels in at least one direction of the array, wherein each pixel comprises a current-driven electroluminescent element that is connected to a supply line by a series drive element in the circuit substrate, and wherein at least some portion of the electroluminescent element is separated by the physical barrier from at least some portion of an electroluminescent element belonging to a neighboring pixel in at least one direction, and wherein the physical barriers are partly of electrically-conductive material that is insulated from the electroluminescent elements and that provides at least a part of the supply line, which conductive barrier material is connected to respective drive elements of at least some of the pixels via contact windows in an intermediate insulating layer between the barriers and the drive elements.

2. A device according to claim 1, wherein an insulating coating extends on the sides and top of the conductive barrier material, and a further supply line comprises upper electrodes of the electroluminescent elements and extends on the insulating coating over the top of the conductive barrier material.

3. A device according to claim 2, wherein the insulating coating forms a capacitor dielectric of a smoothing capacitor between the drive supply line that comprises the conductive barrier material and the further supply line that comprises the upper electrodes of the electroluminescent elements.

4. A device according to claim 1, wherein each pixel has a respective contact window between the conductive barrier material and an electrode connection for the respective drive element of the pixel.

5. A device according to claim 4, wherein at least most of the drive element is located below the conductive barrier material.

6. A device according to claim 1, wherein the drive element of each pixel has a respective electrode located at the contact window where it is connected to the conductive barrier material.

7. A device according to claim 1, wherein each pixel comprises a holding capacitor for holding the drive element in a given conduction state, and the conductive barrier material is connected at the contact window to a node of the drive element and one plate of the holding capacitor.

8. A device according to claim 7, wherein at least most of the holding capacitor is located below the conductive barrier material.

9. A device according to claim 7, wherein the holding capacitors are formed by respective insulated lengths of additional barriers that extend transverse to the supply-line barriers and that comprise a metal coating on a dielectric coating on a metal core.

10. A device according to claim 1, wherein, along the drive supply line, the conductive barrier material has a cross-sectional area that is at least twice as large as (or even at least an order of magnitude larger than) that of a conductor layer that provides the electrode connection to the drive element.

11. A device according to claim 1, wherein, along the drive supply line, the conductive barrier material has a thickness that is at least twice as large as (or even at least 5 times larger than) that of a conductor layer that provides the electrode connection to the drive element.

12. A device according to claim 1, wherein the physical barriers are predominantly of the conductive barrier material (and preferably comprising metal).

13. A device according to claim 1, wherein the physical barriers extend across the whole array as a continuous supply line of the conductive barrier material that is connected to electrode connections for the respective drive elements of the respective pixels.

14. A device according to claim 1, wherein the physical barriers between pixels extend as a network of conductive barrier material in both row and column directions of the array.

15. A device according to claim 1, wherein the electroluminescent element is present at a further window in the intermediate insulating layer and has a lower electrode connection to the drive element.

16. A device according to claim 1, wherein the drive element is a thin film transistor having source and drain electrodes that connect the main current path of the transistor between the conductive barrier material and a lower electrode of the electroluminescent element.

17. A device according to claim 1, wherein the drive elements of the pixels are connected to row and column conductors of the circuit substrate that extend across the array for addressing respective pixels, and the supply lines comprising the barriers extend parallel to the row and/or column conductors.

18. A device according to claim 1, wherein the drive elements of the pixels are connected to row and column conductors of the circuit substrate that extend across the array for addressing respective pixels, and additional barriers of conductive material extend parallel to the row conductors, are insulated from the barriers that form at least part of the drive supply line, and are connected via contact windows in the intermediate insulating layer to the row conductors in the circuit substrate to reduce voltage drops along the row conductors.

19. A device according to claim 1, wherein each electroluminescent element comprises a light-emitting diode of organic semiconductor material between upper and lower electrodes.

20. A method of manufacturing an active-matrix electroluminescent display device as recited in claim 1, including the steps of:
 (a) opening contact windows in the intermediate insulating layer on the circuit substrate to expose electrode connections for respective drive elements of at least some of the pixels;
 (b) forming the physical barriers on the circuit substrate with insulation at least at the sides of the physical barriers adjacent to the pixel areas; and
 (c) providing the electroluminescent elements in the pixel areas in between the physical barriers, wherein the conductive barrier material is provided by depositing electrically-conductive material at least for connection at the contact windows of the intermediate insulating layer.

21. A method according to claim 20, wherein the step (b) involves forming the physical barrier as a core of the electrically-conductive material, and depositing an insulating coating on at least the sides of this conductive barrier material.

22. A method according to claim 21, wherein at least the bulk of the core of conductive barrier material is deposited by plating.

23. A method according to claim 21, wherein the conductive barrier material comprises aluminium, and the insulating coating is formed on at least the sides of the aluminium barrier material by anodisation.

24. A method according to claim 20, wherein the step (b) involves forming the physical barrier predominantly of insulating material through which vias extend for connection with the circuit element at the contact windows of the intermediate insulating layer, and wherein the electrically-conductive material is deposited as a conductive coating on top of the physical barrier and in the vias through the physical barrier.

25. A method according to claim 24, wherein the conductive coating for the physical barrier and an upper electrode of the electroluminescent element are deposited simultaneously and are separated by a shadow-masking effect of an overhang shape in the side of the physical barrier.

* * * * *